United States Patent
Glass et al.

(10) Patent No.: US 7,504,677 B2
(45) Date of Patent: Mar. 17, 2009

(54) MULTI-GATE ENHANCEMENT MODE RF SWITCH AND BIAS ARRANGEMENT

(75) Inventors: Elizabeth C. Glass, Gilbert, AZ (US); Olin L. Hartin, Chandler, AZ (US); Neil T. Tracht, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 627 days.

(21) Appl. No.: 11/092,264

(22) Filed: Mar. 28, 2005

(65) Prior Publication Data

US 2006/0214238 A1    Sep. 28, 2006

(51) Int. Cl.
*H01L 29/80* (2006.01)
*H01L 21/337* (2006.01)

(52) U.S. Cl. .............. 257/268; 257/270; 257/369; 438/188; 438/193

(58) Field of Classification Search ......... 257/268–270, 257/393, 192, 369; 438/193, 195, 188
See application file for complete search history.

(56) References Cited

U.S. PATENT DOCUMENTS

| | | | |
|---|---|---|---|
| 4,662,058 A | 5/1987 | Cirillo, Jr. et al. | |
| 4,729,000 A | 3/1988 | Abrokwah | |
| 4,814,851 A | 3/1989 | Abrokwah et al. | |
| 4,870,478 A | 9/1989 | Weitzel et al. | |
| 5,060,031 A | 10/1991 | Abrokwah et al. | |
| 5,411,903 A | 5/1995 | Wu et al. | |
| 5,444,016 A | 8/1995 | Abrokwah et al. | |
| 5,480,829 A | 1/1996 | Abrokwah et al. | |
| 5,512,518 A | 4/1996 | Cho et al. | |
| 5,514,891 A | 5/1996 | Abrokwah et al. | |
| 5,606,184 A | 2/1997 | Abrokwah et al. | |
| 5,614,739 A | 3/1997 | Abrokwah et al. | |
| 5,693,544 A | 12/1997 | Abrokwah et al. | |
| 5,832,370 A | 11/1998 | Pena-Finol et al. | |
| 5,895,929 A | 4/1999 | Abrokwah et al. | |
| 6,118,338 A | 9/2000 | Frank et al. | |
| 6,211,729 B1 | 4/2001 | Morkner et al. | |
| 6,429,103 B1 | 8/2002 | Johnson et al. | |
| 6,479,843 B2 | 11/2002 | Huang et al. | |
| 6,504,433 B1 | 1/2003 | Weber et al. | |

(Continued)

*Primary Examiner*—Hsien-ming Lee
(74) *Attorney, Agent, or Firm*—Ingrassia, Fisher & Lorenz, P.C.

(57) ABSTRACT

Methods and apparatus are provided for RF switches (100, 200). In a preferred embodiment, the apparatus comprises one or more multi-gate n-channel enhancement mode FET transistors (50, 112, 114). When used in pairs (112, 114) each has its source (74, 133) coupled to a first common RF I/O port (116) and drains coupled respectively to second and third RF I/O ports (118, 120), and gates (136, 138), coupled respectively to first and second control terminals (122, 124). The multi-gate regions (66, 68) of the FETs (50) are parallel coupled, spaced-apart and serially arranged between source (72) and drain (76). Lightly doped n-regions (Ldd, Lds) are provided serially arranged between the spaced-apart multi-gate regions (66, 68), the lightly doped n-regions (Ldd, Lds) being separated by more heavily doped n-regions (84). Bias resistances (132, 134) are provided between the sources (72, 133) and control terminals (122, 124) so as to provide a DC path between the control terminals (122, 124) that maintains the source (72, 133) voltage at the proper bias potential for enhancement mode operation.

19 Claims, 5 Drawing Sheets

U.S. PATENT DOCUMENTS

| | | |
|---|---|---|
| 6,528,405 B1 | 3/2003 | Martinez et al. |
| 6,642,578 B1 | 11/2003 | Arnold et al. |
| 6,730,953 B2 | 5/2004 | Brindle et al. |
| 6,734,509 B2 * | 5/2004 | Ohnakado et al. ........... 257/393 |
| 6,803,680 B2 | 10/2004 | Brindle et al. |
| 6,821,829 B1 | 11/2004 | Peatman et al. |
| 2004/0141470 A1 | 7/2004 | Kelcourse et al. |

* cited by examiner

US 7,504,677 B2

MULTI-GATE ENHANCEMENT MODE RF SWITCH AND BIAS ARRANGEMENT

TECHNICAL FIELD

The present invention generally relates to radio-frequency (RF) switches, and more particularly relates to enhancement mode field-effect transistor (FET) RF switches and means for biasing such switches.

BACKGROUND

RF switches are widely used in modern communication systems. Field effect transistors (FETs) are preferred in many RF switching applications because of their comparatively high OFF impedance, comparatively low ON impedance, low leakage and relatively low drive voltages. One of the most challenging specifications that FET RF switches must meet is for transmit/receive (T/R) switches in the Global System for Mobile Communications (GSM). The power handling, linearity and isolation requirements of the GSM system are very stringent. To meet these challenges, multi-gate FET structures and circuits have been developed. While such implementations are useful they suffer from a number of limitations well known in the art.

FIG. 1 illustrates prior art multi-gate transmit-receive RF switch 10 employing n-channel depletion mode FETs 12, 14 coupled respectively between antenna port 16 and receiver port 18 and transmitter port 20. Resistors Re shunt the source-drain regions of transistors 12, 14. Resistors Rg are in series with the gate leads 13, 15 of transistors 12, 14. Control voltages Vc and Vc(bar) are provided respectively at ports or connections 22, 24. Depletion mode devices 12, 14 are ON at Vgs=0 and OFF when Vgs exceeds the device threshold voltage. DC blocking capacitors ($C_{blk}$) 26, 28, 30 are provided so that the source and drain regions of transistors 12, 14 can float with respect to control voltages Vc, Vc(bar). This permits circuit 10 to operate from a single positive supply of, for example, Vc=+3 volts and Vc(bar)=0 volts (and vice versa). Because of the leakage through the transistors, node 33 will tend to drift to the highest DC operating potential. Then, for example, when Vc=+3 volts and Vc(bar)=0 volts, transistor 12 will usually be ON and transistor 14 will be OFF. When the polarity is reversed (i.e., Vc=0 volts and Vc(bar)=+3 volts), then transistor 12 is usually OFF and transistor 14 is ON. However, it is also common to have additional control pin or connection 32 coupled to node 33 in order to supply the desired operating bias to circuit 10. A significant limitation of this prior art circuit and biasing arrangement is that it is not suitable for use with enhancement mode n-channel devices, which are preferred because of their utility and process compatibility with other circuit elements needed to form a single-chip integrated circuit (IC) that includes, for example, amplifiers and other functions along with one or more RF switches. Accordingly there continues to be a need for improved RF switches, especially for multi-gate enhancement mode RF switches suitable for integration with various other circuit elements needed in monolithic integrated circuits (ICs) for mobile communications.

Accordingly, it is desirable to provide an improved RF switching device and method. It is further desirable that the RF switching device be an enhancement mode FET RF switching device, and that it be adaptable for multi-port applications, especially in transmit-receive or equivalent switching applications. Still further, it is desirable that the FET RF switch be capable of operating from a single positive supply and/or switching voltage and biased to an appropriate operating point without the need for other reference voltages and/or additional control pins. In addition, it is desirable that process technology employed for forming the RF switch be compatible with other communication circuit elements desired to be incorporated in monolithic integrated circuits (ICs) for communication applications. Other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 2:
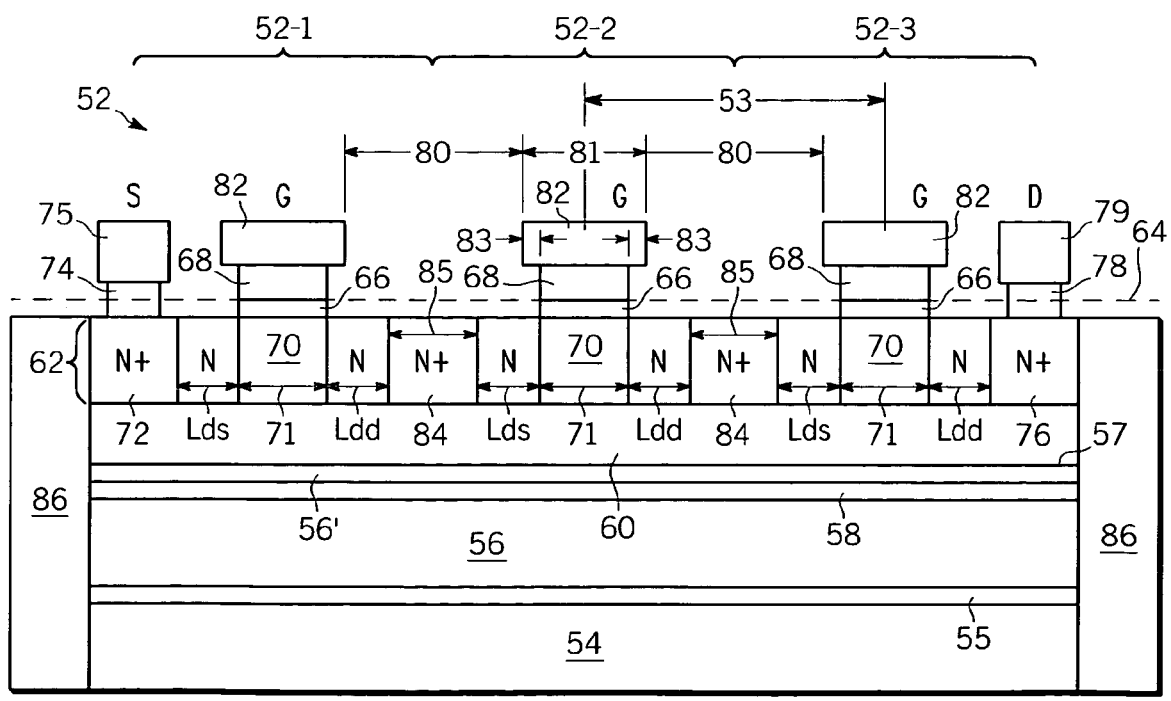
FIG. 2 is a simplified schematic cross-sectional view through a multi-gate, n-channel, enhancement mode FET according to the present invention.

FIG. 2 is a simplified schematic cross-sectional view through multi-gate, n-channel, enhancement mode FET 50 according to the present invention. FET 50 is a multi-gate n-channel enhancement mode hetero-structure insulated gate field effect transistor (E-HIGFET). FET 50 is formed on substrate 54, typically of GaAs single crystal. Optional buffer layer 55 overlying substrate 54 is useful in reducing device leakage but is not essential. Buffer layer 55 can be comprised of a single layer or a plurality of layers and can have a thickness of approximately one hundred to three hundred nanometers. Buffer layer 55 can be comprised of gallium arsenide and/or aluminum gallium arsenide. In the preferred embodiment, buffer layer 55 consists of substantially undoped gallium arsenide and is located on substrate 54. As used herein, the term "undoped" is defined as a doping level of less than approximately 1E12 atoms per centimeter squared. Layer 55 is preferably an epitaxially layer. Commonly assigned U.S. Pat. Nos. 6,429,103, 5,895,929 and 6,821,829 provide information on buffer structures and materials. GaAs layer 56, 56' is provided on substrate 54 or buffer layer 55, e.g., by epitaxial growth. In an exemplary embodiment, layer 56, 56' is of the order of about 2000 Angstroms (Å) in thickness. Narrow region 58 is formed within GaAs layer 56 near its upper surface 57 to adjust the threshold voltage of FET 50. As an example, region 58 can be formed by silicon delta doping to a concentration of approximately 1E11 to 5E12 atoms per centimeter squared. Portion 56' of layer 56 of, for example, about 30 Å thickness, lies above region 58. Layer 60 of, desirably, InGaAs with an indium concentration usefully in the range of 10 to 35 mole percent, preferably 15 to 24 mole percent, is formed above GaAs layer 56. In an exemplary embodiment, layer 60 is about 150 Å thick but thinner or thicker layers can also be used. Substantially insulating AlGaAs layer 62 is then formed above layer 60 with, for example, a thickness of about 250 Å and an aluminum concentration usefully in the range of about 45 to 90 mole percent, preferably about 65 to 85 mole percent. Layers 60, 62 are conveniently formed by epitaxial growth using methods well known in the art. Substantially intrinsic GaAs layer 64 having a thickness of on the order of 6 nm to 9 nm, is then formed above layer 62. Gate regions 68, desirably of a refractory highly conductive metal or semi-metal are formed on portions 66 of upper GaAs layer 64. TiWN is preferred but not essential for regions 68. Most of layer 64 except portions 66 under gate regions 68 is subsequently removed, leaving GaAs layer portions 66 beneath each gate region 68. Portions 66 and gate regions 68 have, for example, length 71 of about $\leq 0.85$ microns, but larger or smaller dimensions may also be used. Gate regions 68 and underlying portions 66 are used as a mask allowing light N doping of AlGaAs layer 62 on either side of gate regions 68. This provides lightly doped N type regions labeled Lds and Ldd in layer 62 on either side of gate regions 68. Initially the lightly doped N region extends everywhere in layer 62 except for channel regions 70 of length 71 beneath portions 66 and gate regions 68, which channel regions 70 remain as substantially undoped insulating AlGaAs. Subsequently, layer 62 outside of channel regions 70 is further N doped to provide $N^+$ or $N^{++}$ doped source region 72, drain region 76 and intermediate regions 84. Metal conductors 82 (e.g., "metal-1") of width 81 are provided over gate regions 68 to reduce the gate series resistance. Metal conductors 82 overhang gate regions 68 by amounts 83 and are separated from each other by distance or separation 80. Metal conductors 82 are conveniently of gold, but other highly conductive materials may also be used. Gate-to-gate pitch 53 and separation While FIG. 2 illustrates multi-gate FET 50 with three series connected devices 52, that is with devices 52-1, 52-2, 52-3, persons of skill in the art will understand based on the description herein that FET 50 can have any number of parallel-coupled but serially arranged gates greater than or equal to one. N+ source region 72 with source contact 74 and source metal conductor 75 is provided at one end of multi-gate FET 50 comprising serially arranged devices 52-1, 52-2, ... 52-G, and N+ drain region 76 with drain contact 78 and drain metal conductor 79 is provided at the other end of multi-gate FET 50. Stated another way, source region 72 with source contact 74 and source conductor 75 is provided on device 52-1 and drain region 76 with drain contact 78 and drain conductor 79 is provided on device 52-G (in FIG. 2, G=3). Intermediate $N^+$ or $N^{++}$ regions 84 serve as the source and drain of the devices on either side of intermediate $N^+$ or $N^{++}$ regions 84. No separate contacts need be provided to such intermediate regions, but that is not precluded. It will be noted that devices 52 are symmetrical. It does not matter which of regions 72, 76 with contacts 74, 78 and conductors 75, 79 is used as the source and which is used as the drain. Accordingly, the words (and abbreviations) "source" (S) and "drain" (D) in connection with FIG. 2 and elsewhere herein are merely for convenience of explanation and not intended to be limiting.

Contacts 74, 78 are conveniently of NiGeAu (but other Ohmic contact materials can also be used) and conductors 75, 79 (e.g., "metal-2") are conveniently of gold but other highly conductive materials may also be used. The designations "metal-1" and "metal-2" are used to indicate the preferred order in which these conductors are applied, but this is not essential. In the preferred embodiment, metal-2 for contacting and interconnecting the source-drain regions is generally thicker than metal-1 for contacting and interconnecting the gate regions. The same diffusion or implant steps for providing N+ regions 72, 76 is also conveniently used to form resistances, such as are employed for example in the circuit of FIG. 3. Capacitances are conveniently formed by providing a metal-insulator-metal (MIM) sandwich comprising, for example, metal-1, an insulating silicon nitride layer and metal-2, but other metals and dielectrics may also be used. Metal-1 and metal-2 and silicon nitride layers are conveniently formed by means well known in the art. While the HIGFET structure illustrated in FIG. 2 is preferred, other types of enhancement mode FET structures can also be used. Further details on the various layers used in the fabrication of FET devices such as are described here can be found in commonly assigned U.S. Pat. Nos. 5,693,544 and 6,821,829. The fabrication 80 between adjacent gate metal conductors 82 of individual devices 52-1, 52-2, 52-3, etc., influence the source-drain breakdown voltage and the source-drain ON-state resistance of FET 50. The larger pitch 53 and separation 80, the larger the breakdown voltage and ON-state resistance. N+ or N++ regions 84 of length 85 are introduced into layer 62 between adjacent devices 52 of multi-gate FET 50 to reduce the series ON-state resistance of multi-gate FET 50. Lightly doped regions Lds and Ldd on either side of portions 66, gate regions 68 and channel regions 70 allow the breakdown voltage of FET 50 to be set to a predetermined value. Making Lds and Ldd larger, increases the device breakdown voltage but can also increase the ON-state resistance. This is avoided or mitigated by providing $N^+$ or $N^{++}$ regions 84 of length 85 between multi-gate devices 52. This substantially reduces the ON-state resistance of FET 50 without significant adverse effect on the breakdown voltage of the device. Ldd (and Lds) contribute to ON-state resistance (Ron) consistent with their sheet resistance, which is usefully about 1100 ohms/square. About 1.1 ohms are contributed by every additional one-micron length of Ldd regions (or Lds regions). With Ldd (or Lds) regions of ~0.3 microns length, about 10 volts is contributed to the breakdown voltage for every additional one-micron in length of Ldd (or Lds). An increase in the length of Ldd and Lds regions to maintain symmetry, from 0.3 microns to 0.4 microns, would increase Ron by about 0.22 ohms, and breakdown voltage by nominally about 1 volt, gate to source and gate to drain.

Substantially insulating lateral isolation walls 86 are desirably but not essentially formed surrounding multi-gate FET 50. In an exemplary embodiment, isolation walls 86 are formed by oxygen implantation into and through the various layers described above down to and into substrate 54. However, other means well known in the art may also be used to form lateral isolation walls 86. In the discussion above, various thicknesses, dimensions and doping levels are indicated, but these are merely by way of exemplary embodiments and not intended to be limiting. Persons of skill in the art will understand based on the description herein that larger and smaller dimensions may be used and larger and smaller doping levels may be used and fewer or more gates may be cascaded, depending upon the target specifications of the particular multi-gate device they desire to form. Thus, the numerical examples provided herein are for purposes of illustration and not limitation. steps described therein are illustrative of steps that may be used by persons of skill in the art to fabricate FET 50 of the present invention based on the description herein and are not intended to be limiting.

Figure 3:
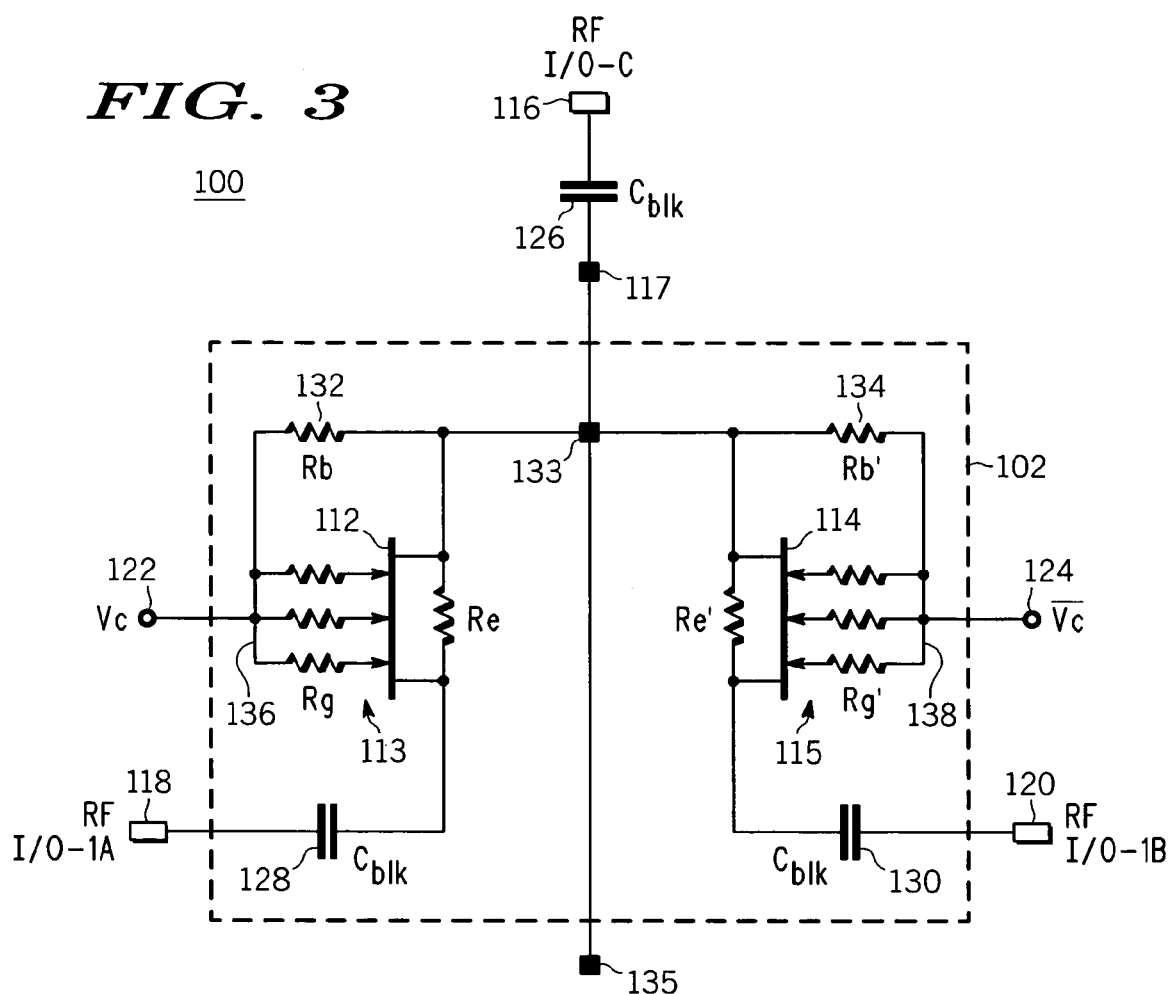
FIG. 3 is a simplified schematic circuit diagram of an RF transmit-receive switch employing the n-channel enhancement mode FETs of FIG. 2 and illustrating the means and method for biasing, according to the present invention.

FIG. 3 is a simplified schematic circuit diagram of RF switch 100 according to an exemplary embodiment of the present invention, employing n-channel enhancement mode FETs 112, 114, and further illustrating how switch 100 is conveniently biased. FETs 112, 114 are preferably like or analogous to FET 50 of FIG. 2, with the same or more or fewer gates. FETs 112, 114 are coupled respectively between RF I/O-C port 116 (e.g., an antenna port) and RF I/O-1A port 118 (e.g., a receiver port) and RF I/O-1B port 120 (e.g., a transmitter port). Resistances Re, Re' shunt the source-drain regions of FETs 112, 114. Resistances Rg, Rg' are series resistances (e.g., formed from further N+ regions) added in series with gate leads or conductors 113, 115 of FETs 112, 114 and are much larger than the intrinsic resistance of the gates and gate conductors. Gate resistances Rg, Rg' conveniently (but not essentially) have substantially the same value and in subsequent discussions the convention is followed of referring to them collectively as Rg, but this is merely for convenience of explanation and not intended to be limiting. Shunt resistances Re, Re' conveniently (but not essentially) have substantially the same value and in subsequent discussions the convention is followed of referring to them collectively as Re, but this is merely for convenience of explanation and not intended to be limiting. Re is on the order of the value of the series resistance Rg. Re and Rg are conveniently additional discrete N+ implanted resistances, but other resistance structures may also be used. The arrowheads on gate leads 113, 115 denotes Schottky gate FETs, but other types of FETs may also be used.

Figure 1:
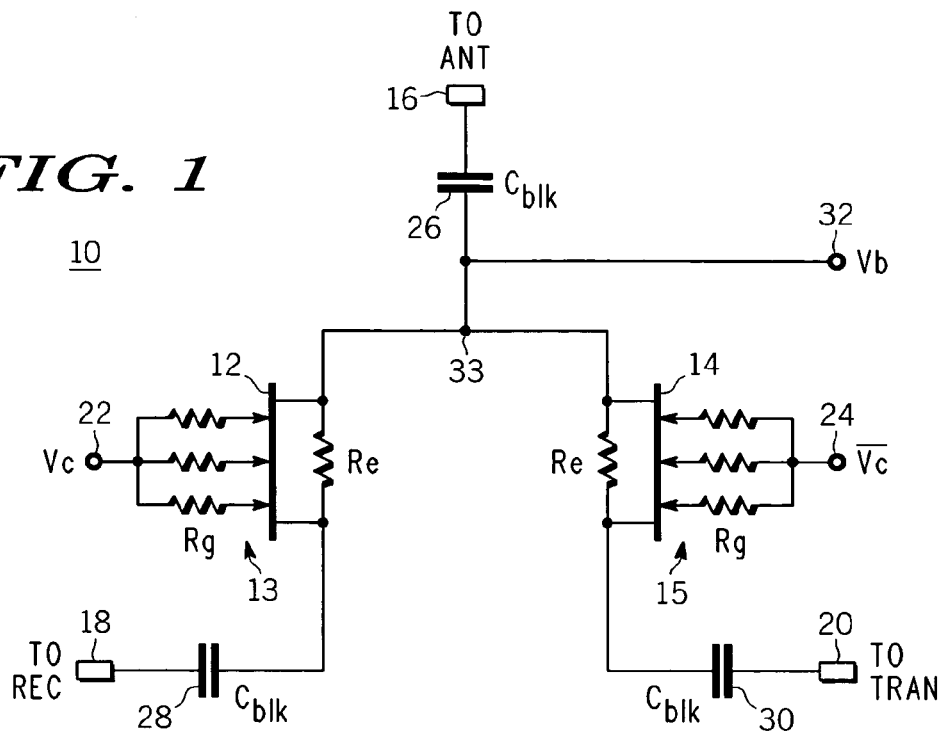
FIG. 1 is a simplified schematic circuit diagram of an RF transmit-receive switch according to the prior art, employing n-channel depletion mode FETs.

Control voltages Vc and Vc(bar) are provided, respectively, at control ports or connections 122, 124. Enhancement mode devices or FETs 112, 114 are OFF at Vgs=0 and ON when Vgs exceeds the device threshold voltage Vth. DC blocking capacitors or capacitances ($C_{blk}$) 126, 128, 130 are provided so that the DC potential of source and drain regions of FETs 112, 114 can be set with respect to control voltages Vc, Vc(bar) by resistances 132, 134 identified as Rb, Rb' respectively. Bias resistances Rb, Rb' conveniently (but not essentially) have substantially the same value and in subsequent discussions the convention is followed of referring to them collectively as Rb, but this is merely for convenience of explanation and not intended to be limiting. Bias resistances Rb 132, 134 are coupled between control ports 122, 124 and common node 133. Resistances Rb 132, 134 form a potential divider that sets the potential of node 133 between Vc and Vc(bar). This permits enhancement mode switch 100 to operate from a single positive supply of, for example, Vc=+3 volts and Vc(bar)=0 volts (and vice versa). For example, when Vc=+3 volts and Vc(bar)=0 volts and resistances Rb 132, 134 are substantially equal, FET 112 will have gate-source voltage $(Vgs)_{112}$=Vc−$V_{133}$ where $V_{133}$ is the potential of node 133, and will turn ON, and FET 114 will have gate-source voltage $(Vgs)_{114}$=Vc(bar)−$V_{133}$ and will be OFF. When the polarity is reversed (i.e., Vc=0 volts and Vc(bar)=+3 volts), then FET 112 is OFF and FET 114 is ON. The voltage at node 133 with Rb=Rg is $V_{133}$~2Vc/3, which will allow the switch to turn ON and OFF properly. Unlike prior art circuit 10 of FIG. 1, no external pin is needed to set the proper bias voltage. This is a significant advantage of the present invention, since minimization of external connections is much desired.

Expressed more generally, the gate-source voltage Vgs appearing across FETs 112, 114 is determined by voltage $V_{133}$ appearing at node 133 and the control voltage Vc appearing at control ports 122, 124. $V_{133}$ is conveniently expressed as a fraction of the control voltage Vc, that is $V_{133}$=k*Vc, where k≦1 is given by the following relation:

$$V_{133}/Vc=k=[Rb/(N-1)]/[(Rb/(N-1))+(Rb*Rg/(Rb+Rg))], \quad [1]$$

where N is the number of branches with FETs 112, 114 in switch 100 or, alternatively stated, one less than the total number of RF I/O ports, since one I/O port is common to both transistors. This may be simplified as:

$$V_{133}/Vc=k=[Rb+Rg]/[Rb+NRg], \quad [2]$$

Figure 5:
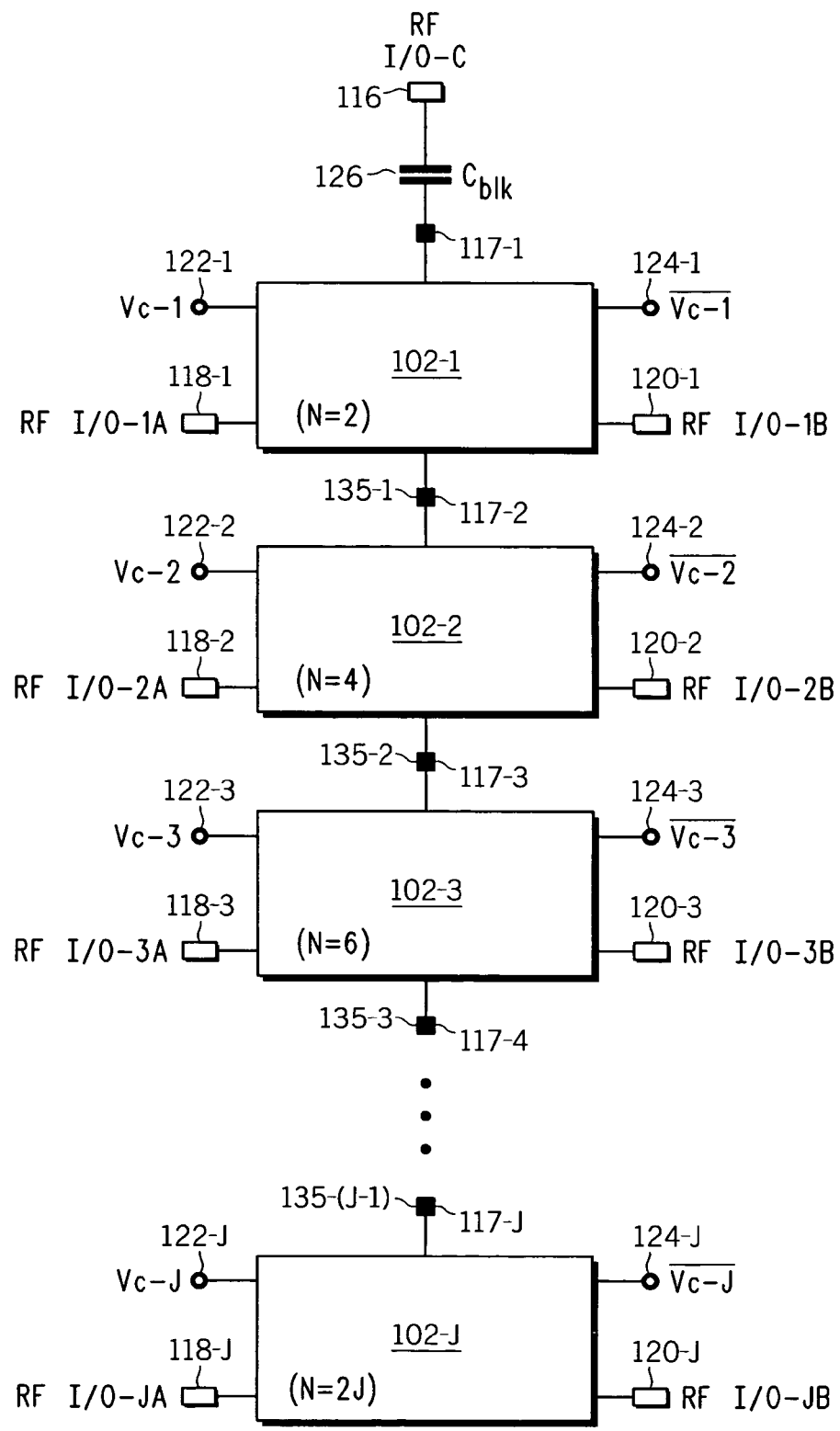
FIG. 5 is a simplified schematic block diagram of a multi-port RF switch according to the present invention.

For switch 100 of FIG. 3, N=2, however N may have larger values (e.g., see FIG. 5), that is, N=2, 3, 4 . . . M, where M is any whole integer, even or odd. In an exemplary embodiment, Rg should be large enough (e.g., of the order of several thousand Ohms) to limit the gate current during breakdown and to RF decouple the gates from the control voltage supply. Also, Rb should be much greater than the RF impedance seen at port 116. The RF impedance seen at port 116 is often of the order of fifty Ohms, so Rb is desirably at least one order of magnitude larger than 50 Ohms. Stated another way, the ratio Rb/Rg is desirably on the order of 0.1≦(Rb/Rg)≦10, more conveniently 0.25≦(Rb/Rg)≦5 and preferably about 0.5≦(Rb/Rg)≦2, with Rb desirably in the range of about 100 Ohms≦Rb≦20 k Ohms, more conveniently about 500≦Rb≦15 k Ohms and preferably about 1 k≦Rb≦10 k Ohms. Suppose by way of example, that Rb/Rg~1, then the equation [2] can be further simplified as:

$$V_{133}/Vc=k=[Rb+Rg]/[(Rb+NRg]=2/(1+N), \quad [3]$$

so that for N=2, k=0.667; for N=3, k=0.5; for N=4, k=0.4 and so forth. Further suppose that Rb/Rg~2, then equation [2] can be simplified as:

$$V_{133}/Vc=k=[Rb+Rg]/[(Rb+NRg]=3/(2+N), \quad [4]$$

so that for N=2, k=0.75; for N=3, k=0.6; for N=4, k=0.5 and so forth. It will be apparent based on the description herein that the values of k may be adjusted depending upon the number of switch branches so that the switches are appropriately biased. The number of switch branches is generally the same as the number of multi-gate FET devices, e.g., shown in switch 100 (FIG. 2) or switch 200 (FIG. 5). It is generally convenient that k be in the range 0.1≦k≦1.0, more conveniently in the range 0.3≦k≦1.0 and preferably in the range 0.5≦k≦0.7. Re is desirably placed from drain to source to equalize the voltages on the drain and source nodes under RF operation for both ON and OFF states. The value of Re is desirably selected to be much much greater than that of the channel resistance of the FET in the ON-state so that it doesn't create a significant parallel path for current conduction. The value of Re is conveniently in the 10's of kilo-Ohm range. It is generally independent of N, Rb and Re. While it is convenient that Re~Re', Rg~Rg' and Rb~Rb' this is not essential, and different values can be used with individual FETs 112, 114 provided that the appropriate bias voltage is maintained at node 133 for enhancement mode operation.

Figure 4:
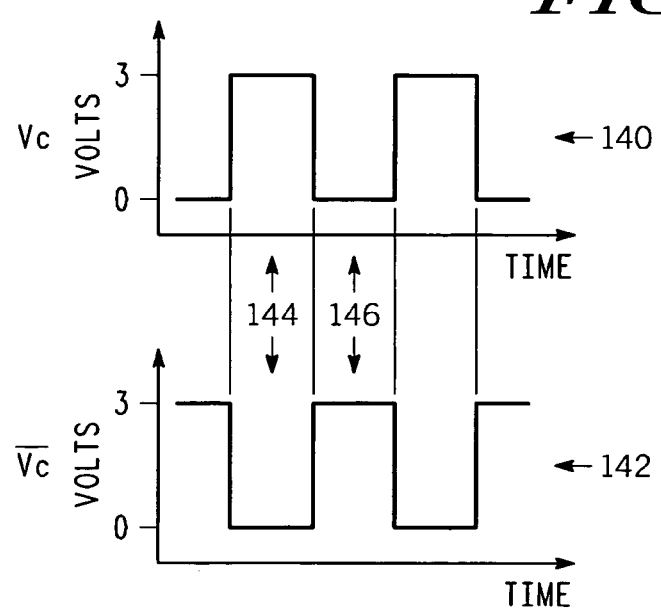
FIG. 4 is a simplified plot of the control voltage applied to the RF switch of FIG. 3, as a function of time.

FIG. 4 shows simplified plots 140, 142 of the control voltage Vc and Vc(bar) applied to RF switch 100 of FIG. 3, as a function of time, assuming that Vc and Vc(bar) range from 0 to +3 volts and vice-versa. As shown in plots 140, 142, during phase 144, Vc=+3 volts and Vc(bar)=0 volts, and during phase 146, Vc=0 volts and Vc(bar)=+3 volts. During phase 144, I/O port 116 (see FIG. 3) is coupled to I/O port 118 while I/O port 120 is blocked, and during phase 146, I/O port 116 is coupled to I/O port 120 while I/O port 118 is blocked. Thus, switch 100 functions as an efficient RF switch in response to control signals provided at control ports 122, 124. The values of Vc, Vc(bar) of +3 and 0 volts are merely exemplary and not intended to be limiting and persons of skill in the art will understand that other values can also be used.

FIG. 5 is a simplified schematic block diagram of multi-port RF switch 200 according to the present invention. Multi-port switch 200 comprises in this illustrative example, J parallel coupled enhancement mode N-channel switches 102 of the type illustrated in FIG. 3, identified successively as 102-1, 102-2, 102-3, . . . , 102-J, Nodes 117-1 through 117-J are analogous to node 117 of FIG. 3 and nodes 117-1 through 117-J are commonly coupled to blocking capacitance 126 and I/O port 116 via nodes 135-1 through 135-(J−1). Node 117-1 of first switch 102-1 is coupled to RF I/O-C port 116, e.g., the antenna port. Node 117-2 of second switch 102-2 is coupled to node 135-1 of first switch 102-1 and, since nodes 117 and 135 in each switch 102 are coupled together, they are therefore also coupled to RF I/O-C port 116. This is repeated for each successive switch 102-3, 102-3 . . . 102-J. Thus, all J RF switches are coupled in parallel to RF-I/O-C port 116. This arrangement is especially useful when a signal to or from RF I/O-C port 116 is desired to be coupled to one or the other of several receiver/transmitter combinations (or other functions), which are in communication for example with RF I/O ports 118-1 and 120-1; 118-2 and 120-2; 118-3 and 120-3; . . . 118-J and 120/J.

Suppose, for example, that multi-port switch 200 is being used to switch among one or the other of several signaling protocols, e.g., GSM, CDMA, TDMA, FDMA, etc. The GSM transmitter and receiver can be connected to ports 118-1, 120-1 respectively, the CDMA transmitter and receiver to ports 118-2, 120-2 respectively, the TDMA transmitter and receiver to ports 118-3, 120-3 respectively and so forth. Control voltages Vc-1, Vc(bar)-1; Vc-2, Vc(bar)-2; Vc-3, Vc(bar)-3 . . . Vc-J, Vc(bar)-J are used to control which switch is activated thereby coupling RF I/O-C port 116 to the desired transmitter or receiver. Equations [1]-[2] can be used to determine the appropriate values of Rb and Rg so that switches 102 operate properly. In the example of FIG. 5, N=2J, and J is the number of parallel three-port switches 102-1 . . . 102-J. FIG. 5 illustrates the situation where each switch 102-$i$ is a three-port switch, that is, with nodes 117-$i$ and I/O ports 118-$i$, and 120-$i$, but this is not essential and any or all of switches 102-$i$ can have fewer ports. Thus, N need not be an even number. For example, suppose switch 102-J (or any other switch 102-$i$) is a two-port rather than a three-port switch adapted to couple RF I/O-C port 116 via node 117-J to RF I/O port 118-J (or RF I/O port 120-J but not both), then N will be odd. Persons of skill in the art will understand how to do this based on the description herein.

Figure 6:
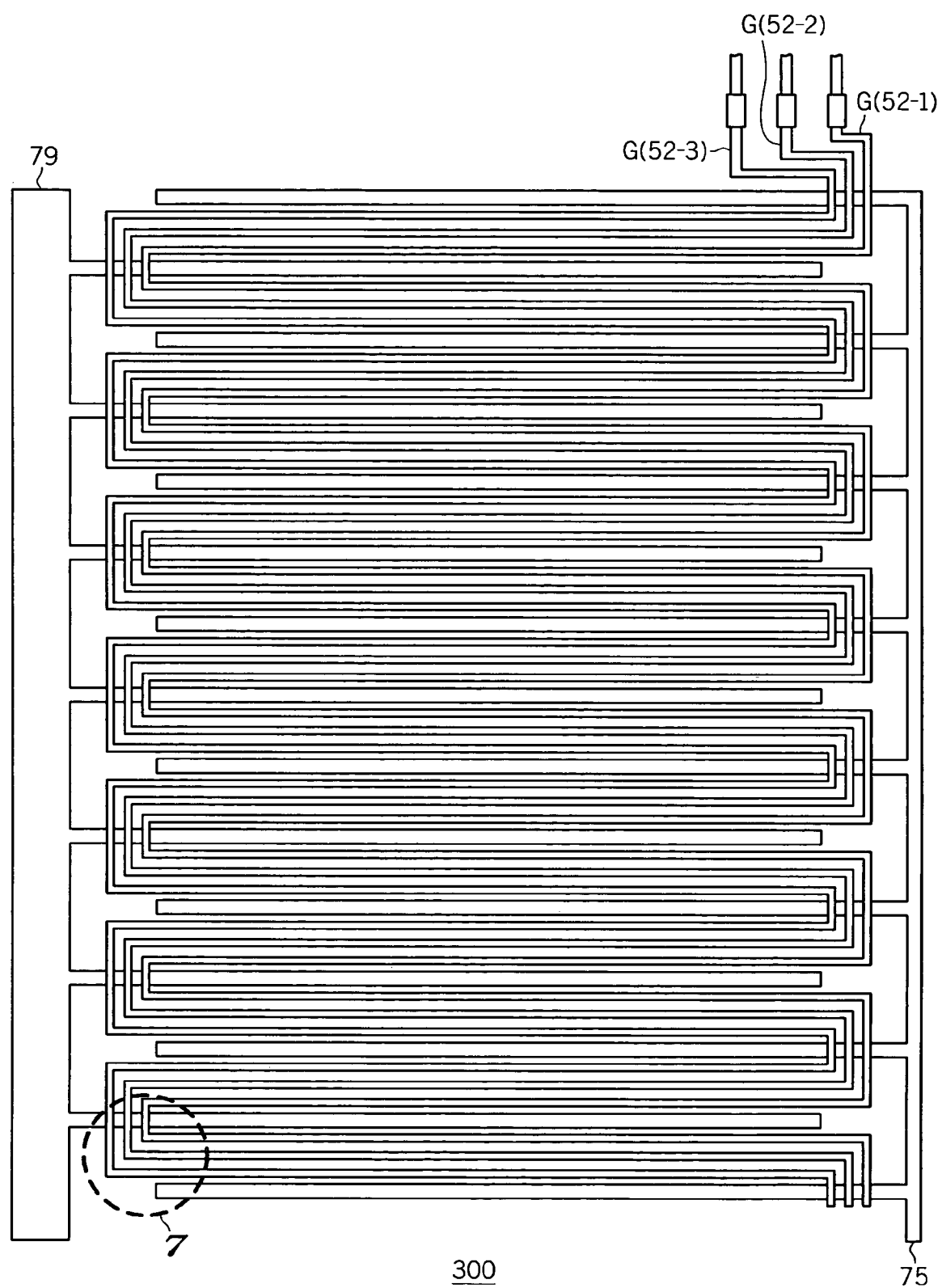
FIG. 6 is a simplified plan view of the FET of FIG. 2.
Figure 7:
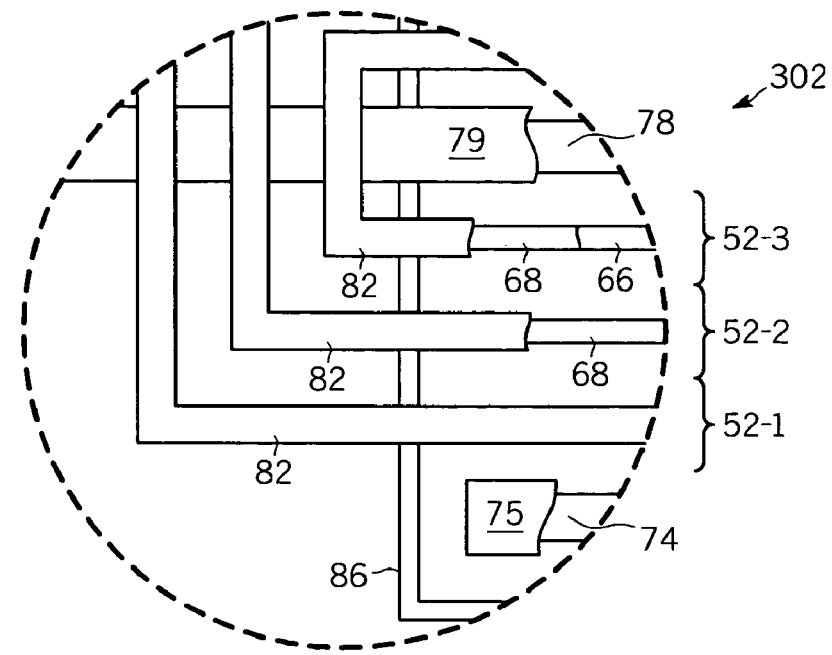
FIG. 7 is an enlarged portion of the plan view of FIG. 6, showing greater detail.

FIG. 6 shows simplified plan view 300 of FET 50 of FIG. 2. FIG. 7 shows enlarged portion 302 of plan view 300 of FIG. 6, presenting greater detail. Contact 74 to source region 72 (see FIG. 2) with overlying metal conductor 75; contact 78 to drain region 76 (see FIG. 2) with overlying metal conductor 79, and gate regions 68 with overlying metal conductors 82 are identified for three gate FET 50 comprising cascaded FET devices 52-1, 52-2, 52-3 shown in cross-section in FIG. 2. In the overall view of FET 50 in FIG. 6, gate leads G(52-1), G(52-2) and G(52-3), respectively, of cascaded devices 52-1, 52-2, 52-3 are indicated. Persons of skill in the art will understand based on the description herein that plan view 300 is presented merely by way of illustration and not limitation, since FET 50 may have any number of plan view arrangements well known in the art.

Figure 8:
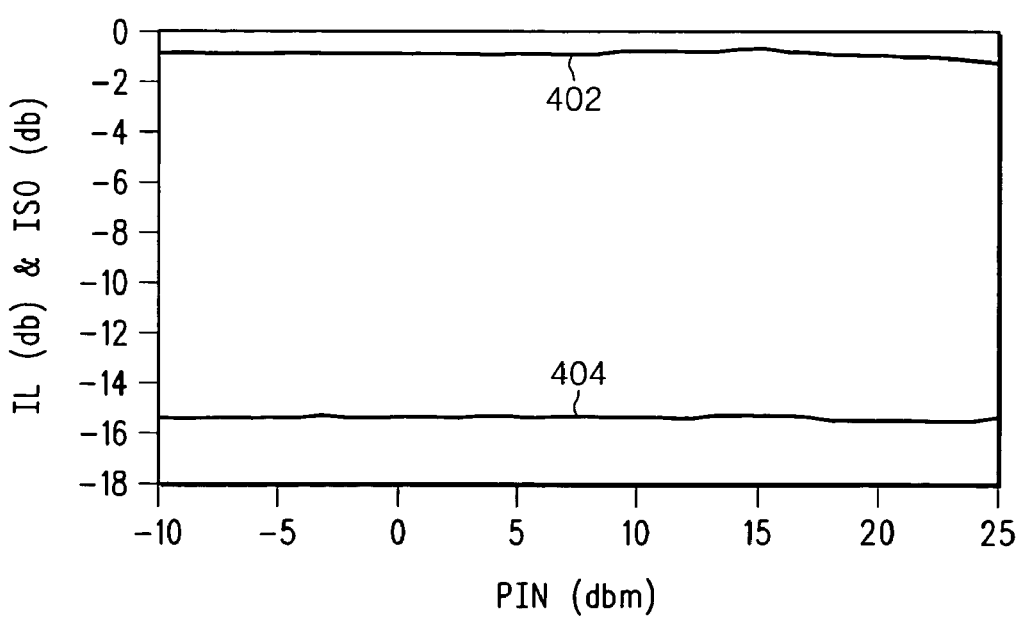
FIG. 8 is a plot of insertion loss versus RF input power for the RF switch of the present invention in the ON and OFF states.

FIG. 8 shows plot 400 of insertion loss (IL) versus RF input power (Pin) for the RF switch of the present invention in the ON state (trace 402) and the OFF state (trace 404). It will be apparent that the present invention has very low insertion loss in the ON-state and excellent isolation in the OFF state, that is substantially independent of the RF power level from −10 to +25 dbm. The present invention operates at frequencies of the order of 3.5 GHz and with switching voltages of about three volts and zero volts. Thus, the invented arrangement provides a device exhibiting excellent properties. Higher power levels with similar low insertion loss can be obtained by increasing the number of gates and/or the total device periphery.

In a first exemplary embodiment there is provided an n-channel enhancement mode FET. RF switch, comprising, a first source, a first drain, multiple parallel coupled first gate regions serially arranged and spaced apart between the first source and first drain, wherein each spaced-apart first gate region is separated from its neighbor by first and second lightly doped n-regions, and wherein there is provided a first more heavily doped n-region located between the spaced-apart first gate regions, separating the first and second lightly doped n-regions. In an additional exemplary embodiment the RF switch further comprises, a second source coupled to the first source, a first RF I/O port coupled to the first and second sources, a second drain, a second RF I/O port coupled to the first drain, a third RF I/O port coupled to the second drain, multiple parallel coupled second gate regions serially arranged and spaced apart between the second source and the second drain, wherein each spaced-apart second gate region is separated from its neighbor by third and fourth lightly doped n-regions, and wherein there is provided a second more heavily doped n-region located between the spaced-apart second gate regions, separating the third and fourth lightly doped n-regions. A yet additional exemplary embodiment further comprises, first bias resistance Rb coupled between the first source and a first node coupled to the multiple first gate regions, and second bias resistances Rb' coupled between the second source and a second node coupled to the multiple second gate regions. A still additional exemplary embodiment further comprises, a first control input port coupled to the first node, a second control input port coupled to the second node, wherein the first node is coupled to each multiple first gate region by a gate resistance Rg, and wherein the second node is coupled to each multiple second gate region by a gate resistance Rg'. In a further exemplary embodiment, Rb~Rb' and Rg~Rg' and a bias voltage between the first gate regions and the first source is determined at least in part by the relationship [Rb+Rg]/[Rb+NRg] where N is one less than a total number of RF I/O ports. A yet still additional exemplary embodiment comprises, a DC blocking capacitor coupled between the first RF I/O port and the first and second sources, a second DC blocking capacitor coupled between the second RF I/O port and the first drain, and a third DC blocking capacitor coupled between the third RF I/O port and the second drain. In a still further exemplary embodiment, the first source, first drain and first gate regions form a first transistor and the second source, second drain and second gate regions form a second transistor and the first and second transistors are formed substantially simultaneously on a common substrate.

In a second exemplary embodiment, there is provided an RF switch, comprising, first and second control inputs, first, second and third DC blocking capacitors each having first and second terminals, first, second and third RF I/O ports, coupled respectively to the first terminals of the first, second and third DC blocking capacitors, a first enhancement mode multi-gate FET device having source, drain and gate terminals, wherein its source terminal is coupled to the second terminal of the first DC blocking capacitor, its drain terminal is coupled to the second terminal of the second DC blocking capacitor and its gate terminals are coupled to the first control input, a second enhancement mode multi-gate FET device having source, drain and gate terminals, wherein its source terminal is coupled to the second terminal of the first DC blocking capacitor, its drain terminal is coupled to the second terminal of the third DC blocking capacitor and its gate terminals are coupled to the second control input, and first and second bias resistances Rb, Rb', each having first and second terminals, wherein the first bias resistor Rb has its first terminal coupled to the second terminal of the first DC blocking capacitor and its second terminal coupled to the first control input, and the second bias resistor Rb' has its first terminal coupled to the second terminal of the first DC blocking capacitor and its second terminal coupled to the second control input. An additional second exemplary embodiment comprises, one or more resistances Rg coupled between each gate terminal of the first enhancement mode multi-gate FET device and the first control input, and one or more resistances Rg' coupled between each gate terminal of the second enhancement mode multi-gate FET device and the second control input. In a further second exemplary embodiment Rg~Rg' and Rb~Rb' and the ratio (Rb/Rg) is conveniently in the range $0.1 \leq (Rb/Rg) \leq 10$, desirably in the range $0.25 \leq (Rb/Rg) \leq 5$ and more preferably in the range $0.5 \leq (Rb/Rg) \leq 2$. In a still further second exemplary embodiment, the gate-source voltage Vgs of the first enhancement mode multi-gate FET device is given substantially by $Vc-V_{133}$ where Vc is a voltage on the first control input and $V_{133}$ is a voltage on the source terminal of the first enhancement mode multi-gate FET device expressed as a fraction k of a control voltage Vc by the equation $V_{133}/Vc = k = [Rb/(N-1)]/[(Rb/(N-1))+(Rb*Rg/(Rb+Rg)]$, where N is one less than a total number of RF I/O ports. In a yet further second exemplary embodiment, k is conveniently in the range $0.1 \leq k \leq -1$, desirably in the range $0.3 \leq k \leq 1$ and more preferably in the range $0.5 \leq k \leq 0.7$.

In a third exemplary embodiment, there is provided a multi-mode RF switch, comprising, at least two independent RF switches, each comprising, first and second control inputs, first, second and third DC blocking capacitors each having first and second terminals, first, second and third RF I/O ports, coupled respectively to the first terminals of the first, second and third DC blocking capacitors, wherein the first RF I/O ports of the at least two otherwise independent RF switches are coupled together in parallel, a first enhancement mode multi-gate FET device having source, drain and gate terminals, wherein its source terminal is coupled to the second terminal of the first DC blocking capacitor, its drain terminal is coupled to the second terminal of the second DC blocking capacitor and its gate terminals are coupled to the first control input, a second enhancement mode multi-gate FET device having source, drain and gate terminals, wherein its source terminal is coupled to the second terminal of the first DC blocking capacitor, its drain terminal is coupled to the second terminal of the third DC blocking capacitor and its gate terminals are coupled to the second control input, and first and second bias resistances Rb, Rb', each having first and second terminals, wherein the first bias resistor Rb has its first terminal coupled to the second terminal of the first DC blocking capacitor and its second terminal coupled to the first control input, and the second bias resistor Rb' has its first terminal coupled to the second terminal of the first DC blocking capacitor and its second terminal coupled to the second control input. An additional third exemplary embodiment comprises in each independent switch, one or more resistances Rg coupled between each gate terminal of the first enhancement mode multi-gate FET device and the first control input, and one or more resistances Rg' coupled between each gate terminal of the second enhancement mode multi-gate FET device and the second control input. In a further third embodiment, the gate-source voltage Vgs of the first enhancement mode multi-gate FET device of each subsidiary RF switch is given substantially by $Vc-V_{133}$ where Vc is a voltage on the first control input and $V_{133}$ is a voltage on the source terminal of the first enhancement mode multi-gate FET device expressed as a fraction k of the control voltage Vc by the equation $V_{133}/Vc = k = [Rb+Rg]/[Rb+NRg]$, where N is one less than a total number of independent RF I/O ports of the multi-mode switch. In a still further third exemplary embodiment, k is conveniently in the range $0.1 \leq k \leq 1$.

While at least one exemplary embodiment has been presented in the foregoing detailed description, it should be appreciated that a vast number of variations exist. It should also be appreciated that the exemplary embodiment or exemplary embodiment are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An n-channel enhancement mode field effect transistor (FET) radio frequency (RF) switch, comprising:
    a first source;
    a second source coupled to the first source;
    a first RF input/output (I/O) port coupled to the first and second sources;
    a first drain;
    a second drain;
    a second RF input/output (I/O) port coupled to the first drain;
    a third RF I/O port coupled to the second drain;
    multiple parallel coupled first gate regions serially arranged and spaced apart between the first source and first drain;
    multiple parallel coupled second gate regions serially arranged and spaced apart between the second source and the second drain;
    first and second lightly doped n-regions, wherein each first gate region is separated from each other first gate region by the first and second lightly doped n-regions;
    a first more heavily doped n-region as compared with the first and second lightly doped n-regions, which is located between the first gate regions, separating the first and second lightly doped n-regions;
    third and fourth lightly doped n-regions, wherein each second gate region is separated from each other second gate region by the third and fourth lightly doped n-regions; and
    a second more heavily doped n-region as compared with the third and fourth lightly doped n-regions, which is located between the second gate regions, separating the third and fourth lightly doped n-regions.

2. The RF switch of claim 1, further comprising:
first bias resistance Rb coupled between the first source and a first node coupled to the multiple parallel coupled first gate regions; and
second bias resistances Rb' coupled between the second source and a second node coupled to the multiple parallel coupled second gate regions.

3. The RF switch of claim 2 further comprising:
a first control input port coupled to the first node;
a second control input port coupled to the second node;
wherein the first node is coupled to each of the multiple parallel coupled first gate regions by a gate resistance Rg'; and
wherein the second node is coupled to each of the multiple parallel coupled second gate regions by a gate resistance Rg'.

4. The RF switch of claim 3 wherein Rb~Rb' and Rg~Rg' and a bias voltage between the multiple parallel coupled first gate regions and the first source is determined at least in part by the relationship [Rb+Rg]/[Rb+NRg] wherein N is one less than a total number of RF I/O ports.

5. The RF switch of claim 4 further comprising:
a DC blocking capacitor coupled between the first RF I/O port and the first and second sources;
a second DC blocking capacitor coupled between the second RF I/O port and the first drain; and
a third DC blocking capacitor coupled between the third RF I/O port and the second drain.

6. The RF switch of claim 1 wherein the first source, the first drain, and the multiple parallel coupled first gate regions form a first transistor, and the second source, the second drain, and the multiple parallel coupled second gate regions form a second transistor, and the first and second transistors are formed substantially simultaneously on a common substrate.

7. An n-channel enhancement mode field effect transistor (FET) radio frequency (RF) switch, comprising:
a first source;
a first drain;
a first gate region;
a second gate region;
a third gate region, wherein the first gate region, the second gate region, and the third gate region are parallel coupled, serially arranged, and spaced apart between the first source and first drain;
first lightly doped n-regions on a first side of the first gate region, the second gate region, and the third gate region;
second lightly doped n-regions on a second opposite side of the first gate region, the second gate region, and the third gate region, wherein the first gate region is separated from the second gate region by a first lightly doped n-region and a second lightly doped n-region, and the second gate region is separated from the third gate region by another first lightly doped n-region and another second lightly doped n-region;
a first more heavily doped n-region as compared with the first and second lightly doped n-regions, which is located between the first gate region and the second gate region, and is directly adjacent to both the first lightly doped n-region and the second lightly doped n-region; and
a second more heavily doped n-region as compared with the first and second lightly doped n-regions, which is located between the second gate region and the third gate region, and is directly adjacent to both the another first lightly doped n-region and the another second lightly doped n-region.

8. The RF switch of claim 7, further comprising:
a second source coupled to the first source;
a first RF input/output (I/O) port coupled to the first and second sources;
a second drain;
a second RF I/O port coupled to the first drain;
a third RF I/O port coupled to the second drain; and
fourth, fifth, and sixth parallel coupled gate regions serially arranged and spaced apart between the second source and the second drain.

9. The RF switch of claim 8, further comprising:
first bias resistance Rb coupled between the first source and a first node coupled to the first, second, and third gate regions; and
second bias resistances Rb' coupled between the second source and a second node coupled to the fourth, fifth, and sixth gate regions.

10. The RF switch of claim 9 further comprising:
a first control input port coupled to the first node;
a second control input port coupled to the second node;
wherein the first node is coupled to each of the first, second, and third gate regions by a gate resistance Rg; and
wherein the second node is coupled to each of the fourth, fifth, and sixth gate regions by a gate resistance Rg'.

11. The RF switch of claim 10 wherein Rb~Rb' and Rg~Rg' and a bias voltage between the first, second, and third gate regions and the first source is determined at least in part by the relationship [Rb+Rg]/[Rb+NRg] wherein N is one less than a total number of RF I/O ports.

12. The RF switch of claim 11 further comprising:
a DC blocking capacitor coupled between the first RF I/O port and the first and second sources;
a second DC blocking capacitor coupled between the second RF I/O port and the first drain; and
a third DC blocking capacitor coupled between the third RF I/O port and the second drain.

13. An n-channel enhancement mode field effect transistor (FET) radio frequency (RF) switch, comprising:
a first source;
a first drain;
a first gate region;
a second gate region, wherein the first gate region and the second gate region are parallel coupled, serially arranged, and spaced apart between the first source and first drain;
first lightly doped n-regions on a first side of the first gate region and the second gate region;
second lightly doped n-regions on a second opposite side of the first gate region and the second gate region, wherein the first gate region is separated from the second gate region by a first lightly doped n-region and a second lightly doped n-region;
a first more heavily doped n-region as compared with the first and second lightly doped n-regions, which is located between the first gate region and the second gate region, and is directly adjacent to both the first lightly doped n-region and the second lightly doped n-region;
a second source coupled to the first source;
a first RF input/output (I/O) port coupled to the first and second sources;
a second drain;
a second RF I/O port coupled to the first drain;
a third RF I/O port coupled to the second drain; and
multiple additional gate regions that are parallel coupled, serially arranged, and spaced apart between the second source and the second drain.

14. The RF switch of claim 13, further comprising:

third and fourth lightly doped n-regions, wherein each of the multiple additional gate regions is separated from each other of the multiple additional gate regions by the third and fourth lightly doped n-regions; and a second more heavily doped n-region as compared with the third and fourth lightly doped n-regions, which is located between the multiple additional gate regions, separating the third and fourth lightly doped n-regions.

15. The RF switch of claim 14, further comprising:

first bias resistance Rb coupled between the first source and a first node coupled to the first and second gate regions; and second bias resistances Rb' coupled between the second source and a second node coupled to the multiple additional gate regions.

16. The RF switch of claim 15, further comprising:

a first control input port coupled to the first node;

a second control input port coupled to the second node;

wherein the first node is coupled to each of the first and second gate regions by a gate resistance Rg; and wherein the second node is coupled to each of the multiple additional gate regions by a gate resistance Rg'.

17. The RF switch of claim 16, wherein Rb~Rb' and Rg~Rg' and a bias voltage between the first and second gate regions and the first source is determined at least in part by the relationship [Rb+Rg]/[Rb+NRg] wherein N is one less than a total number of RF I/O ports.

18. The RF switch of claim 17 further comprising:

a DC blocking capacitor coupled between the first RF I/O port and the first and second sources;

a second DC blocking capacitor coupled between the second RF I/O port and the first drain; and a third DC blocking capacitor coupled between the third RF I/O port and the second drain.

19. The RF switch of claim 13, wherein the first source, the first drain, the first gate region, and the second gate region form a first transistor, and the second source, the second drain, and the multiple additional gate regions form a second transistor, and the first and second transistors are formed substantially simultaneously on a common substrate.

* * * * *

UNITED STATES PATENT AND TRADEMARK OFFICE
CERTIFICATE OF CORRECTION

PATENT NO. : 7,504,677 B2
APPLICATION NO. : 11/092264
DATED : March 17, 2009
INVENTOR(S) : Glass et al.

Page 1 of 1

It is certified that error appears in the above-identified patent and that said Letters Patent is hereby corrected as shown below:

Column 11, line 13, "Rg'" should be changed to --Rg--.

Signed and Sealed this

Nineteenth Day of May, 2009

JOHN DOLL
*Acting Director of the United States Patent and Trademark Office*